(12) United States Patent
Wang et al.

(10) Patent No.: US 10,608,619 B1
(45) Date of Patent: Mar. 31, 2020

(54) POWER-ON RESET CIRCUIT AND RELATED RESET METHOD

(71) Applicant: Artery Technology Co., Ltd., Chongqing (CN)

(72) Inventors: Zhengxiang Wang, Chongqing (CN); Chen-Chun Huang, Chongqing (CN); Hung-Yu Lin, Chongqing (CN)

(73) Assignee: Artery Technology Co., Ltd., Chongqing (CN)

( * ) Notice: Subject to any disclaimer, the term of this patent is extended or adjusted under 35 U.S.C. 154(b) by 0 days.

(21) Appl. No.: 16/362,729

(22) Filed: Mar. 25, 2019

(30) Foreign Application Priority Data

Oct. 23, 2018 (CN) .......................... 2018 1 1235050

(51) Int. Cl.
| | | |
|---|---|---|
| H03L 7/00 | (2006.01) | |
| H03K 17/22 | (2006.01) | |
| G06F 1/24 | (2006.01) | |
| H03K 5/01 | (2006.01) | |
| G05F 1/46 | (2006.01) | |
| H03K 3/037 | (2006.01) | |
| H03K 5/00 | (2006.01) | |

(52) U.S. Cl.
CPC ............... *H03K 5/01* (2013.01); *G05F 1/461* (2013.01); *H03K 3/037* (2013.01); *H03K 2005/00078* (2013.01)

(58) Field of Classification Search
CPC .................... H03K 5/01; H03K 3/037; H03K 2005/00078; G05F 1/461
See application file for complete search history.

(56) References Cited

U.S. PATENT DOCUMENTS 7,952,402 B2 * 5/2011 Illegems ................ H03K 17/20
327/142
8,803,580 B2 * 8/2014 Shi ......................... H03K 17/20
327/143

\* cited by examiner

*Primary Examiner* — Kenneth B Wells
(74) *Attorney, Agent, or Firm* — Winston Hsu

(57) ABSTRACT

A power-on reset circuit arranged to generate a reset signal according to a power supply voltage includes: a power supply voltage detector, a holding circuit, a reference voltage generator and a reset determination circuit. The power supply voltage detector is controllable by the reset signal, and arranged to detect a level of the power supply voltage to generate a detection signal. The holding circuit is arranged to output an enablement signal according to the detection signal, wherein the holding circuit selectively maintains a level of the enablement signal according to a level of the detection signal. The reference voltage generator is controllable by the enablement signal to selectively output a reference voltage. The reset determination circuit is arranged to output the reset signal according to the power supply voltage and the reference voltage.

11 Claims, 6 Drawing Sheets

POWER-ON RESET CIRCUIT AND RELATED RESET METHOD

BACKGROUND OF THE INVENTION

1. Field of the Invention

The present invention relates generally to power-on reset, and more particularly, to a power-on reset circuit having a power supply voltage detector and related reset method.

2. Description of the Prior Art

Typically, a power-on reset (PoR) circuit is provided in an integrated circuit to generate a reset signal for reset circuit components in the integrated circuit. The purpose of the PoR circuit is to ensure various circuit components in the integrated circuit can be placed in a known state at the beginning of operation. In the conventional art, there are two different types of the PoR circuits, one of which is based on the threshold voltage Vt of MOS transistors, while the other of which is based on a bandgap voltage reference. The advantage of the PoR circuit based on the threshold voltage Vt is simplicity and stability. However, such PoR circuit is less accurate. This is because the threshold voltage Vt often drifts with various factors, such as temperature and process. This may eventually lead to improper resets. The PoR circuit based on a bandgap reference voltage circuit has the advantage of high precision. However, due to its complicated architecture, internal components of the PoR circuit are more likely to malfunction due to complicated interactions between components, especially the bandgap reference voltage circuit. The bandgap reference voltage circuit may be affected by the power supply voltage and thus output an inaccurate reference voltage. Therefore, such type of the PoR circuit will face reliability issues. In view of the above, there is a need to improve the PoR circuits in the conventional art.

SUMMARY OF THE INVENTION

It is an object of the present invention to provide an innovative architecture of a PoR circuit. The PoR circuit of the present invention comprises a power supply voltage detector, which is provided to ensure stability of a power supply voltage, thereby ensuring reliability of a reference voltage generator in the PoR circuit. In addition, the architecture of the PoR circuit of the present invention also includes a holding circuit for maintaining detection results outputted by the power supply voltage detector. Under certain conditions, the power supply voltage detector can be disabled/shut down to reduce power consumption. The holding circuit can keep driving the reference voltage generator by using the detection result, such that the PoR circuit of the present invention can still operate properly even if the power supply voltage detector is shut down.

According to one embodiment of the present invention, a power-on reset circuit arranged to generate a reset signal according to a power supply voltage is provided. The power-on circuit comprises: a power supply voltage detector, a holding circuit, a reference voltage generator and a reset determination circuit. The power supply voltage detector is controllable by the reset signal, and arranged to detect a level of the power supply voltage to generate a detection signal. The holding circuit is coupled to the power supply voltage detector, and arranged to output an enablement signal according to the detection signal, wherein the holding circuit selectively maintains a level of the enablement signal according to a level of the detection signal. The reference voltage generator is coupled to the holding circuit, and controllable by the enablement signal to selectively output a reference voltage. The reset determination circuit is coupled to the reference voltage generator, and arranged to output the reset signal according to the power supply voltage and the reference voltage.

According to one embodiment of the present invention, a power-on reset method arranged to output a reset signal according to a power supply voltage is provided. The power-on reset method comprises: detecting a level of the power supply voltage to generate a detection signal; utilizing a holding circuit to output an enablement signal according to the detection signal; selectively outputting a reference voltage according to the enablement signal; and outputting the reset signal according to the power supply voltage and the reference voltage.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
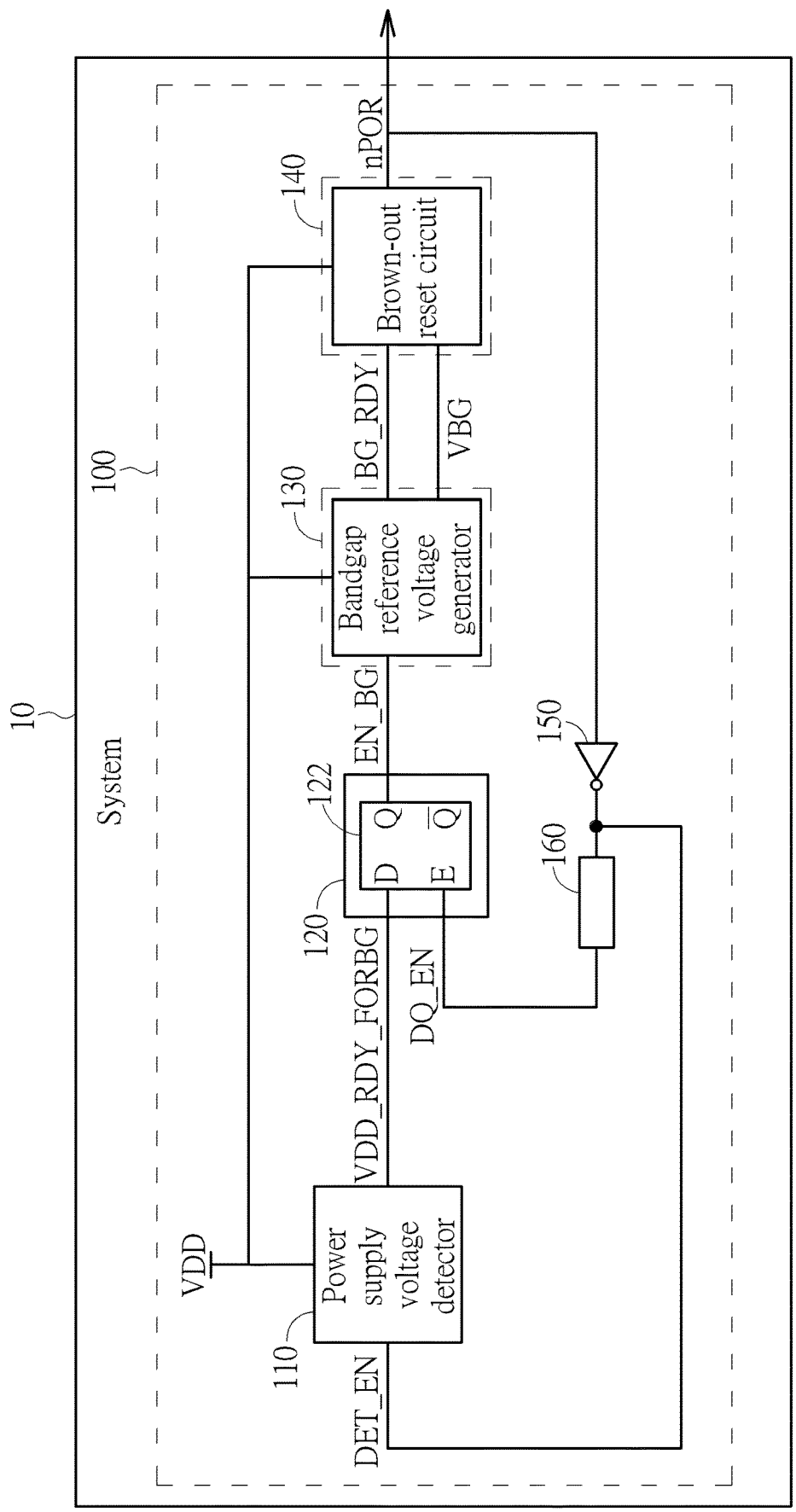
FIG. 1 is a functional block diagram a power-on reset circuit according to one embodiment of the present invention.

FIG. 1 is a block diagram of a power-on rest (PoR) circuit according one embodiment of the present invention. As depicted, the PoR circuit 100 comprises: a power supply voltage detector 110, a holding circuit 120, a reference voltage generator 130 and a reset determination circuit 140. Typically, the PoR circuit 100 is applied to a system 10, and generates a reset signal nPOR for the system 10 (when the system 10 is powered on) in accordance with a power supply voltage VDD that is used to power the system 10. According to the reset signal nPOR, one or more elements (not shown) in the system 10 will be reset.

The PoR circuit 100 relies upon the reference voltage generator 130 for generating a stable reference voltage VBG. In one embodiment, the reference voltage generator 130 could be a bandgap reference voltage generator. The reference voltage VBG is provided to the reset determination circuit 140. The reset determination circuit 140 determines whether the power supply voltage VDD reaches a predetermined level by comparing the power supply voltage VDD with the reference voltage VBG. As a consequence, the reset determination circuit 140 determines whether the system 10 enters a power-on state and accordingly generates the reset signal nPOR. In one embodiment, the reset determination circuit 140 could be a brown-out reset (BOR) circuit, wherein the BOR circuit 140 could compare the power supply voltage VDD or a divided voltage VDD_div (that is derived by dividing the power supply voltage VDD through a resistor network) with the reference voltage VBG, thereby to determine whether the level of the power supply voltage VDD is higher than a minimum voltage level vdd_min_sys that is required by the system 10 to operate properly. When the power supply voltage VDD is higher than the minimum voltage level vdd_min_sys, the BOR circuit 140 outputs the reset signal nPOR having a logic high level (which represents the level of the power supply voltage VDD is sufficient to make the system 10 operate properly); otherwise the BOR circuit 140 outputs the reset signal nPOR having a logic low level (which represents the level of the power supply voltage VDD is not sufficient to make the system 10 operate properly).

An intended purpose of the power supply voltage detector 110 is to guarantee the bandgap reference voltage generator 130 can operate properly. As the PoR circuit 100 is powered by the power supply voltage VDD, the power supply voltage detector 110 is employed to detect the level of the power supply voltage VDD when the system 10 is powered on and accordingly determines whether the level of the power supply voltage VDD is sufficient to make the bandgap reference voltage generator 130 operate properly and reliably. When the level of the power supply voltage VDD is not sufficient, the bandgap reference voltage generator 130 and the reset determination circuit 140 will be disabled/shut down, thereby to prevent the PoR circuit 100 from outputting an improper reset signal nPOR.

The power supply voltage detector 110 is arranged to detect the level of the power supply voltage VDD and accordingly generates a detection signal VDD_RDY_FORBG. The detection signal VDD_RDY_FORBG is utilized to enable the bandgap reference voltage generator 130. When the level of the power supply voltage VDD is not high enough (i.e., lower than a threshold level vdd_min_bg that is required by the bandgap reference voltage generator 130 to operate properly and reliably), the power supply voltage detector 110 de-asserts the level of the detection signal VDD_RDY_FORBG, thereby to disable the bandgap reference voltage generator 130. Also, as the bandgap reference voltage generator 130 is disabled, a standby signal BG_RDY outputted by the bandgap reference voltage generator 130 will be de-asserted such that the reset determination circuit 140 will be disabled. As a consequence, the reset signal nPOR is de-asserted. On the other hand, if the power supply voltage detector 110 detects the level of the power supply voltage VDD is higher than the threshold level vdd_min_bg, the power supply voltage detector 110 asserts the level of the detection signal VDD_RDY_FORBG, thereby to enable the bandgap reference voltage generator 130. Also, when the reference voltage VBG is in a stable state, the reference voltage generator 130 asserts the standby BG_RDY, thereby to enable the BOR circuit 140. Accordingly, the BOR circuit 140 starts to detect the level of power supply voltage VDD and determines whether to change the level of the reset signal nPOR to reset the system 10. Under the control of the power supply voltage detector 110 and the standby signal BG_RDY, the PoR circuit 100 of the present invention can be more safe and reliable.

In one embodiment, the power supply voltage detector 110 could be disabled/shut down after the reset signal nPOR is asserted. This is because the asserted reset signal nPOR means the level of power supply voltage VDD is sufficient to make the bandgap reference voltage generator 130 operate properly and reliably. Hence, it is unnecessary to make the power supply voltage detector 110 keep monitoring the level of the power supply voltage VDD. The power supply voltage detector 110 could be disabled/shut down to reduce the overall power consumption of the PoR circuit 100. On other hand, when the power supply voltage VDD is lower than a minimum level vdd_min_sys that is required by the system 10 to operate properly, the BOR circuit 140 will output the reset signal nPOR having logic low level, thereby to enable/turn on the power supply voltage detector 110 again. The power supply voltage detector 110 would start to monitor whether the level of power supply voltage VDD is further lower than the threshold level vdd_min_bg that is required by the bandgap reference voltage generator 130 to operate properly (since the level vdd_min_bg is lower than the level vdd_min_sys).

Moreover, in order to operate PoR circuit 100 properly after the power supply voltage detector 110 is disabled/shut down, the PoR circuit 100 could further comprise a holding circuit 120. In a preferred embodiment, the holding circuit 120 is implemented with a D-type latch. The intended purpose of the latch 120 is to store the state of the detection signal VDD_RDY_FORBG. When the reset signal nPOR has the logic high level, the latch 120 could store the current state of the detection signal VDD_RDY_FORBG and accordingly output it as the enablement signal EN_BG. In other words, even if the power supply voltage detector 110 is disabled/shut down, since the enablement signal EN_BG outputted by the latch 120 exhibits the previous state of the detection signal VDD_RDY_FORBG, the reference voltage generator 130 and the BOR circuit 140 can keep operating properly. On the other hand, when the reset signal nPOR has the logic low level, it means that the level of the power supply voltage VDD is lower than the threshold level vdd_min_sys that is required by the system. 10 to operate properly. Hence, the latch 120 will not store the state of the detection signal VDD_RDY_FORBG. Instead, the latch 120 directly outputs the detection signal VDD_RDY_FORBG as the enablement signal EN_BG.

Moreover, the PoR circuit 100 may further comprise a delay unit 160, which provides a delay time. This is intended for ensuring the stability of the power supply voltage detector 110. That is, even though the toggling of the reset signal nPOR changes the operating state of the power supply voltage detector 110, the latch 120 will not store the state of the detection signal VDD_RDY_FORBG immediately. Instead, the latch 120 stores the state of the detection signal VDD_RDY_FORBG after the delay time. This can ensure the detection signal VDD_RDY_FORBG is outputted while the power supply voltage detector 110 operates in a stable state.

In one embodiment, the PoR circuit 100 could further comprise an inverter 150. The inverter 150 is placed in a feedback path of the reset signal nPOR and arranged to inverse it in phase. However, the inverter 150 is not a limitation of the present invention, which may be saved according to phase relationship between an operating type of an enablement input of the latch 120 (i.e., positive triggering or negative triggering), an enablement type of the power supply voltage detector 110 (i.e., positive triggering or negative triggering) and/or the reset signal nPOR.

Figure 2A:
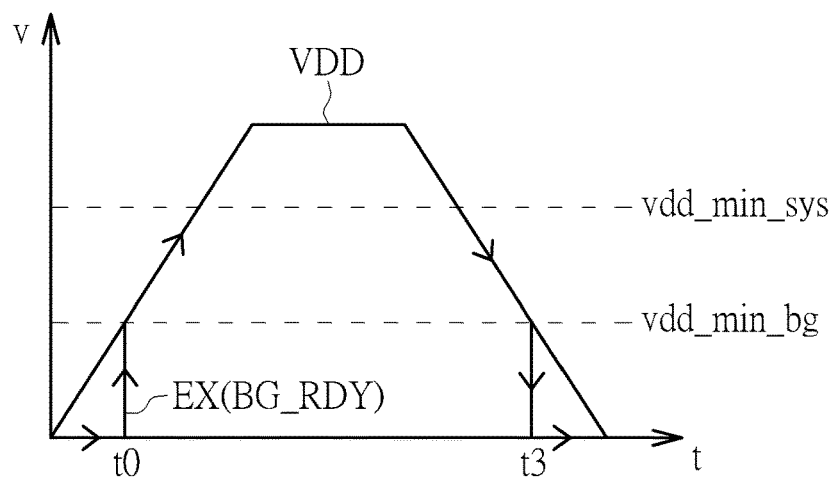
FIGS. 2A-2C illustrate how various signals in a power-on reset circuit of the present invention vary with changes in a power supply voltage.
Figure 2B:
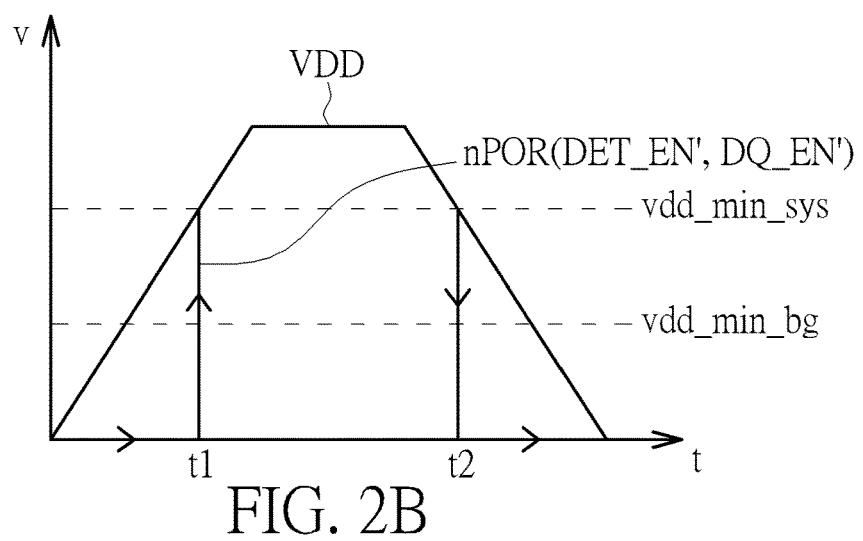
Figure 2C:
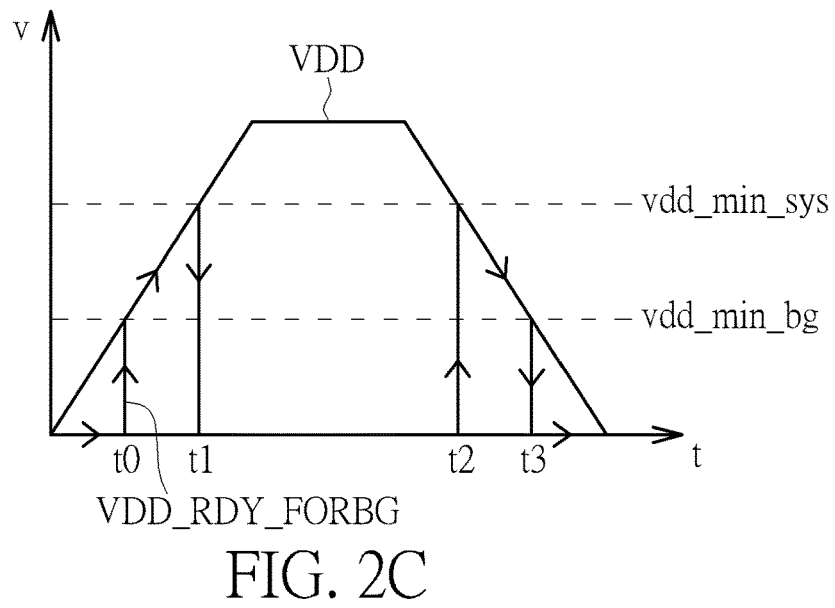

FIGS. 2A-2C illustrate changes of various signals in the PoR circuit 100 of the present invention. FIG. 2A illustrates how the signal EN_BG and the signal BG_RDY change with the power supply voltage VDD. As illustrated by FIG. 2A, when the system 10 is powered on, the power supply voltage VDD starts to rise up. At time t0, the level of the power supply voltage VDD is higher than the threshold level vdd_min_bg (which is a minimum voltage level required by the bandgap reference voltage generator 130 to operate properly). Thus, the signal EN_BG and the signal BG_RDY is asserted and gradually reaches the level of the power supply voltage VDD. On the other hand, after the power supply voltage VDD starts to drop down and is lower than the threshold level vdd_min_bg at time T3, the signal EN_BG and the signal BG_RDY will be de-asserted.

FIG. 2B illustrates how the signal nPOR, signal DET_EN' (an inverted version of the signal DET_EN) and signal DQ_EN' (an inverted version of the signal DQ_EN) change with the power supply voltage VDD. When the system 10 is powered on, the level of the power supply voltage VDD starts to rise up. At time t1, the level of the power supply voltage VDD is higher than the threshold level vdd_min_sys. Thus, the signals nPOR, DET_EN' and DQ_EN' are asserted and gradually reaches the level of the power supply voltage VDD. On the other hand, when the power supply voltage VDD starts to drop down and is lower than the threshold level vdd_min_sys at time T2, the signals nPOR, DET_EN', DQ_EN' are thus de-asserted.

FIG. 2C illustrates how the signal VDD_RDY_FORBG changes with the power supply voltage VDD. When the system 10 is powered on, the power supply voltage VDD starts to rise up. At time t0, the level of the power supply voltage VDD is higher than the threshold level vdd_min_bg, and the signal VDD_RDY_FORBG is thus asserted. Also, the level of the power supply voltage VDD keeps rising up and exceeds the threshold level vdd_min_sys at time T1. At time T1, the power supply voltage detector 110 is disabled/shut down, and the signal VDD_RDY_FORBG is de-asserted. On the other hand, when the power supply voltage VDD starts to drop down and below the threshold level vdd_min_sys at time T2, the power supply voltage detector 110 is enabled/turned on and the signal VDD_RDY_FORBG will be asserted. At time t3, as the level of the power supply voltage VDD is lower than the threshold level vdd_min_bg, the power supply voltage detector 110 determines that the level of the power supply voltage VDD is not sufficient for the bandgap reference voltage generator 130 to operate properly. Thus, the power supply voltage detector 110 de-asserts the signal VDD_RDY_FORBG, thereby to disable/shut down reference voltage generator 130.

Figure 3:
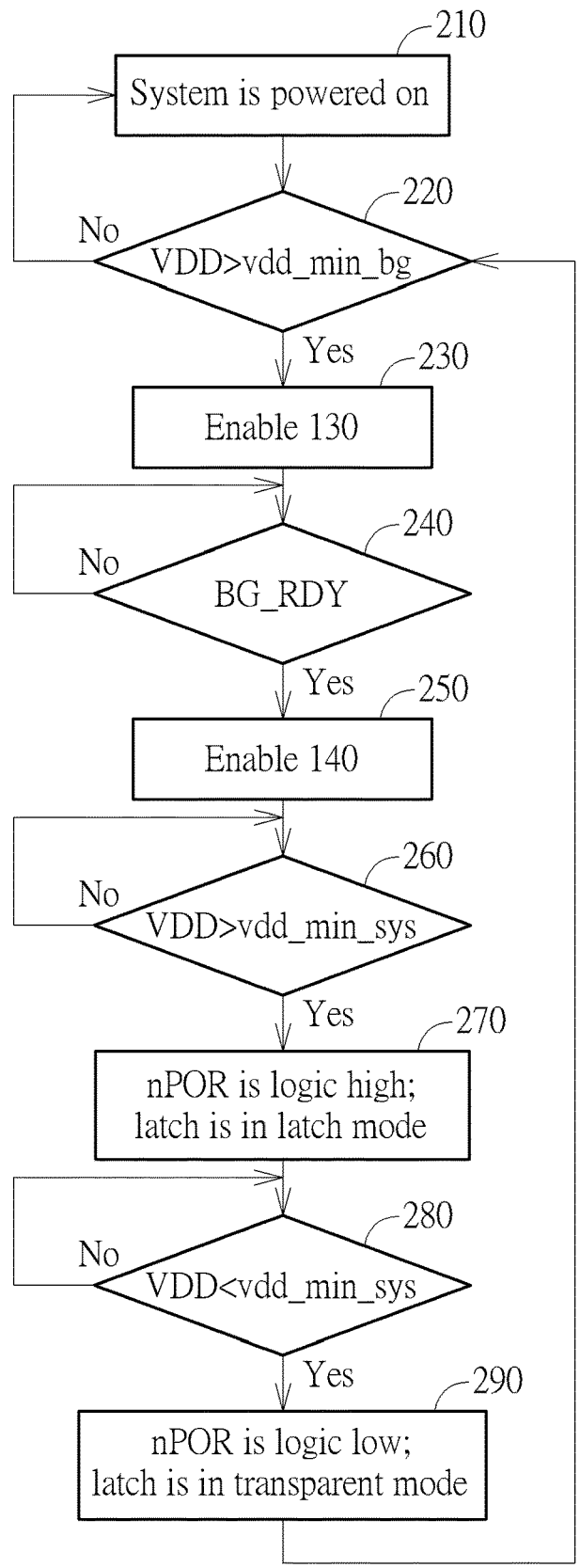
FIG. 3 is a flowchart regarding operations of a power-on reset circuit according to one embodiment of the present invention.

FIG. 3 is a flowchart regarding operations of a power-on reset circuit according to one embodiment of the present invention. At first, the system is powered on at step 210. At step 220, it is determined whether the power supply voltage VDD is higher than the threshold level vdd_min_bg; if no, the flow returns to step 210, which waits for the power supply voltage VDD to rise up. If yes, the flow goes to step 230. At step 230, as the power supply voltage VDD is higher than the threshold level vdd_min_bg, the bandgap reference voltage generator 130 is enabled. At step 240, it is determined whether the signal BG_RDY is asserted (which will be asserted when the bandgap reference voltage generator 130 operates in a stable state); if no, the flow stays in step 240. If yes, the flow goes to step 250. At step 250, as the signal BG_RDY is asserted, the BOR circuit 140 will be enabled. At step 260, it is determined whether the power supply voltage VDD is higher than the threshold level vdd_min_sys. If no, the flow stays in step 260; if yes, the flow goes to step 270. At step 270, as the power supply voltage VDD has been higher than the threshold level vdd_min_sys, which means the PoR circuit 100 has operated in a stable state, the reset signal nPOR having the logic high level will be outputted. Also, the power supply voltage detector 110 can be disabled/shut down. By the latch 120 storing the last state of the signal VDD_RDY_FORBG outputted by the power supply voltage detector 110, the signal BG_EN can keep its state, and enable the bandgap reference voltage generator 130 and BOR circuit 140 steadily.

At step 280, the flow determines whether the power supply voltage VDD is lower than the level vdd_min_sys. If no, the flow stays at step 280; if yes, the flow goes to step 290. At step 290, as the power supply voltage VDD drops below the threshold level vdd_min_sys, the reset signal nPOR will be de-asserted to the logic low level, which enables the power supply voltage detector 110 again. At this time, the latch 120 does not latch a last state of its input, but reflects the change of the signal VDD_RDY_FORBG at input terminal to the signal BG_EN at its output terminal (transparent).

Figure 4:
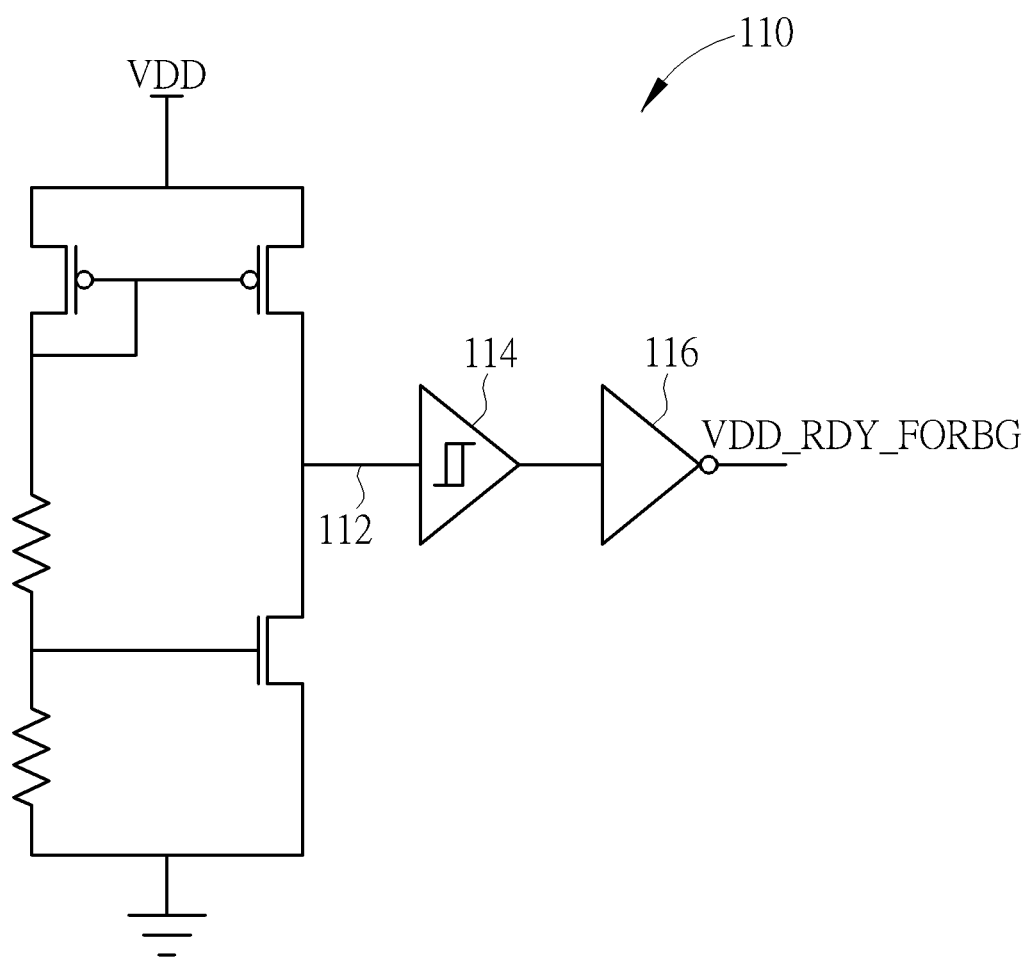
FIG. 4 is a circuit diagram showing a possible implementation of a power supply voltage detector in a power-on reset circuit of the present invention.
Figure 5:
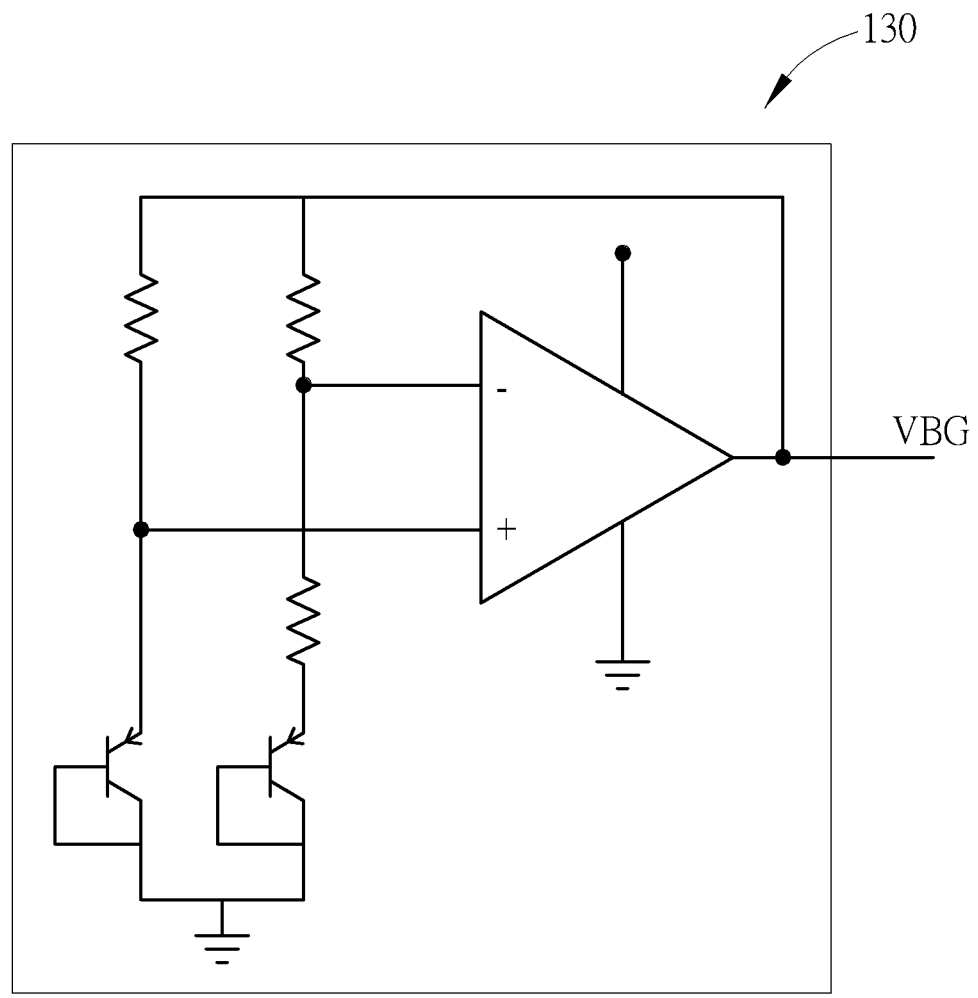
FIG. 5 is a circuit diagram showing a possible implementation of a bandgap reference voltage generator in a power-on reset circuit of the present invention.
Figure 6:
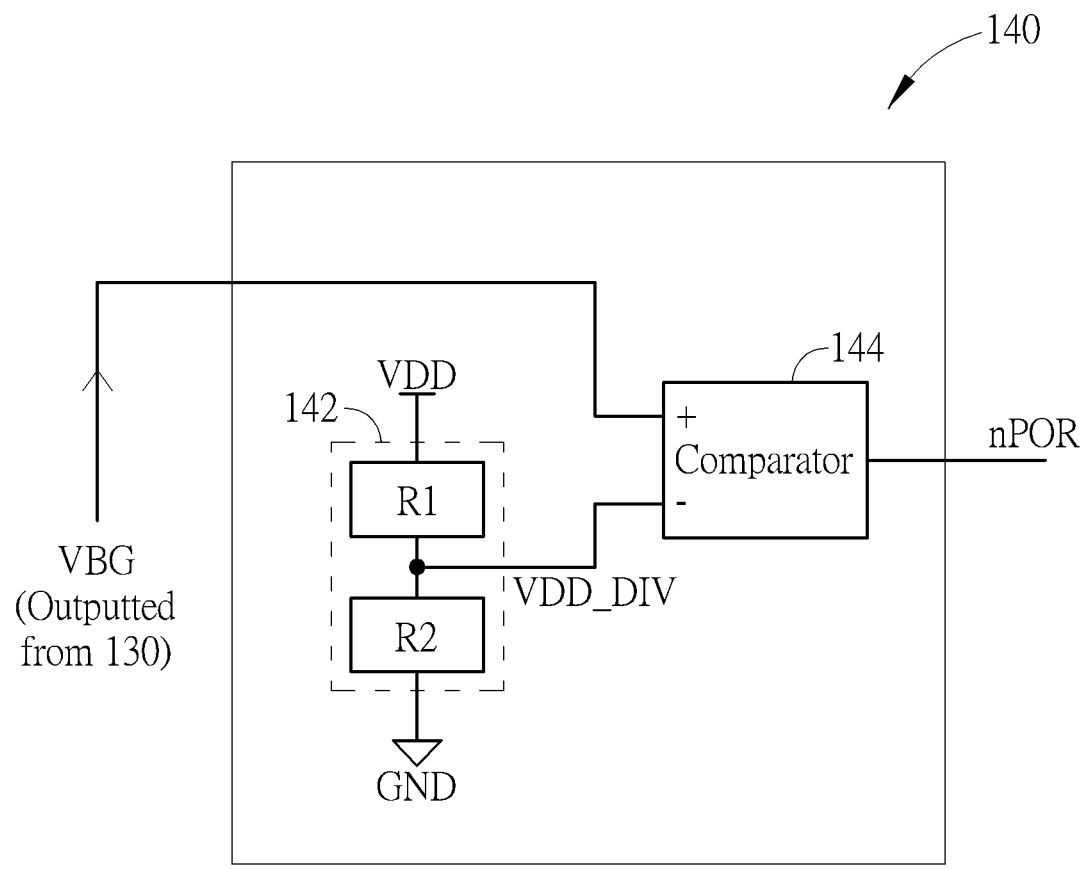
FIG. 6 is a circuit diagram showing a possible implementation of a brown-out reset circuit in a power-on reset circuit of the present invention.

According to various embodiments of the present invention, the power supply voltage detector 110 may have circuitry as illustrated by FIG. 4. When the system 10 is powered on, a state of a terminal 112 will be changed, thereby to change an output state of a Schmitt trigger 114 and the signal VDD_RDY_BG will be outputted through the inverter 116 accordingly. The bandgap reference voltage generator 130 may comprise architecture as illustrated by FIG. 5. Moreover, the BOR circuit 140 may comprise architecture as illustrated by FIG. 6. The power supply voltage VDD may be sampled through a resistor network 142 and compared by a comparator 144 with the reference voltage VBG generated from the bandgap reference voltage generator 130. Accordingly, the comparator 144 generates the reset signal nPOR. However, architecture regarding the power supply voltage detector 110, the bandgap reference voltage generator 130 and the BOR circuit 140 illustrated by FIGS. 4-6 is not a limitation of the present invention.

The present invention features the power supply voltage detector 110. Due to the power supply voltage detector 110, it is possible to prevent the bandgap reference voltage generator 130 from being operated improperly and unreliably such that the BOR circuit 140 will not an output improper reset signal due to instability of other components in the PoR circuit 100. For example, when the level of the power supply voltage VDD is not sufficient (e.g., lower than the threshold level vdd_min_bg), the power supply voltage detector 110 is operable to disable the bandgap reference voltage generator 130 by de-asserting the level of the detection signal VDD_RDY_FORBG and disable the BOR circuit 140 (by the bandgap reference voltage generator 130 de-asserting the level of the enablement signal BG_RDY). Through the power supply voltage detector 110 and the enablement signal BG_RDY, the PoR circuit 100 will not easily output an improper reset signal. Another feature of the present invention is the holding circuit 120. The holding circuit 120 allows the power supply voltage detector 110 to be turned off when the level of the power supply voltage VDD is at a high and steady level (i.e., higher than the threshold levels vdd_min_bg and vdd_min_sys) such that the overall power consumption of the PoR circuit 100 can be significantly reduced. Hence, the present invention provides a stable, safe, reliable PoR circuitry, which has favorable power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power-on reset (PoR) circuit arranged to generate a reset signal according to a power supply voltage, comprising:
    a power supply voltage detector, controllable by the reset signal, arranged to detect a level of the power supply voltage to generate a detection signal;
    a holding circuit, coupled to the power supply voltage detector, arranged to output an enablement signal according to the detection signal, wherein the holding circuit selectively maintains a level of the enablement signal according to a level of the detection signal;
    a reference voltage generator, coupled to the holding circuit, controllable by the enablement signal to selectively output a reference voltage; and
    a reset determination circuit, coupled to the reference voltage generator, arranged to output the reset signal according to the power supply voltage and the reference voltage.

2. The PoR circuit of the claim 1, wherein when the reset signal has a first logic level, the power supply voltage detector is disabled/shut down.

3. The PoR circuit of the claim 1, wherein the reference voltage generator is arranged to further generate a standby signal to enable the reset determination circuit.

4. The PoR circuit of the claim 1, wherein the holding circuit comprises a latch, which generates the enablement signal according to the reset signal and the detection signal.

5. The PoR circuit of the claim 4, further comprising:
    a delay unit, arranged to delay the reset signal, wherein the latch generates the enablement signal according to the delayed reset signal and the detection signal.

6. The PoR circuit of the claim 4, wherein when the reset signal has a first logic level, the latch stores a state of the detection signal and outputs it as the enablement signal; and when the reset signal has a second logic level, the latch outputs the detection signal as the enablement signal.

7. A power-on reset (PoR) method arranged to generate a reset signal according to a power supply voltage, comprising:
    detecting a level of the power supply voltage to generate a detection signal;
    utilizing a holding circuit to output an enablement signal according to the detection signal;
    selectively outputting a reference voltage according to the enablement signal;
    generating a standby signal according to the enablement signal; and
    based on the standby signal, determining whether to output the reset signal according to the power supply voltage and the reference voltage.

8. The PoR method of claim 7, wherein the step of detecting the level of the power supply voltage comprises:
    stopping detecting the level of the power supply voltage when the reset signal has a first logic level.

9. The PoR method of claim 7, wherein the holding circuit comprises a latch and the step of outputting the enablement signal according to the detection signal comprises:
    utilizing the latch to generate the enablement signal according to the reset signal and the detection signal.

10. The PoR method of claim 9, further comprising:
    delaying the reset signal; and
    utilizing the latch to generate the enablement signal according to the delayed reset signal and the detection signal.

11. The PoR method of claim 9, wherein:
    when the reset signal has a first logic level, utilizing the latch to store a state of the detection signal and outputting it as the enablement signal; and
    when the reset signal has a second logic level, utilizing the latch to output the detection signal as the enablement signal.

* * * * *